(12) United States Patent
Wu et al.

(10) Patent No.: US 8,030,214 B2
(45) Date of Patent: Oct. 4, 2011

(54) METHOD OF FABRICATING GATE STRUCTURES

(75) Inventors: Pochi Wu, Zhubei (TW); Ju-Wang Hsu, Taipei (TW); Ryan Chia-Jen Chen, Chiayi (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 12/708,586

(22) Filed: Feb. 19, 2010

(65) Prior Publication Data

US 2011/0207315 A1 Aug. 25, 2011

(51) Int. Cl.
*H01L 21/311* (2006.01)
(52) U.S. Cl. ....................................... 438/694
(58) Field of Classification Search .................. None
See application file for complete search history.

(56) References Cited

U.S. PATENT DOCUMENTS

| | | | | |
|---|---|---|---|---|
| 2008/0045022 A1* | 2/2008 | Kurihara et al. | ............... | 438/694 |
| 2009/0014812 A1* | 1/2009 | Wang et al. | ................... | 257/392 |
| 2009/0101956 A1* | 4/2009 | Booth et al. | ................... | 257/301 |
| 2010/0270627 A1* | 10/2010 | Chang et al. | ................... | 257/411 |

* cited by examiner

*Primary Examiner* — Charles Garber
*Assistant Examiner* — André C Stevenson
(74) *Attorney, Agent, or Firm* — Lowe Hauptman Ham & Berner, LLP

(57) ABSTRACT

An embodiment of the disclosure includes a method of forming metal gate structures. A substrate is provided. A first dummy gate electrode and a second dummy gate electrode are formed on the substrate. The first dummy gate electrode comprises first spacers on its sidewalls and the second dummy gate electrode comprises second spacers on its sidewalls. A hardmask layer is formed to covers both the first dummy gate electrode and the second dummy gate electrode. A patterned photoresist layer on the hardmask layer that covers a portion of the hardmask layer over the second dummy gate electrode and that leaves a portion of the hardmask layer over the first dummy gate electrode exposed. The portion of the exposed hardmask layer over the first dummy gate electrode is removed. The first spacers and the first dummy gate electrode is exposed to a first plasma environment comprising O2, HBr, and $Cl_2$. The first dummy gate electrode is removed in a second plasma environment comprising NF3, HBr, and $Cl_2$ thereby leaving a hole surrounded by the first spacers. The hole is filled with a metal gate layer.

20 Claims, 6 Drawing Sheets

US 8,030,214 B2

METHOD OF FABRICATING GATE STRUCTURES

TECHNICAL FIELD

The disclosure relates generally to integrated circuit fabrication, and more particularly to a method for forming metal gate structures.

BACKGROUND

As the dimensions of transistors decrease, the thickness of the gate oxide must be reduced to maintain performance with the decreased gate length. However, in order to reduce gate leakage, high dielectric constant (high-k) gate oxide layers are used which allow greater physical thicknesses while maintaining the same effective thickness as would be provided by a typical gate oxide used in future technology nodes.

Additionally, as technology nodes shrink, in some integrated circuit (IC) designs, there has been a desire to replace the typical polysilicon gate electrode with a metal gate electrode to improve device performance with the decreased feature sizes. One process of forming the metal gate electrode is termed "gate last" process because the final metal gate electrode is fabricated after the other transistor components, which allows for reduced number of subsequent processes, including high temperature processing, that must be performed after formation of the gate.

FIG. 1 shows a cross-sectional view of a plurality of conventional gate structures for semiconductor device 100 at a fabrication stage in a "gate last" process. The semiconductor device 100 in FIG. 1 comprises a P-well region 102 and an N-well region 103 formed within a substrate. An isolation structure 104 is formed between the P-well region 102 and the N-well region 103. Gate structures 101 are formed on the P-well 102 region and the N-well region 103, respectively. The gate structures 101 include a high K dielectric layer 106 and a metal layer 107 below a dummy gate electrode 105. Spacers 108a and 108b is disposed adjacent to the gate structure 101. An interlayer dielectric layer 109 (ILD) is formed to surround the spacer 108a and 108b. A hardmask layer 110 and a photoresist layer 111 are deposited and patterned to expose the dummy gate electrode 105 in N-well region 103. An etching step is performed to remove the exposed dummy gates 105 for forming a recess for accommodating a metal gate electrode. The metal gate electrodes above the P-Well region 102 and N-well region 103 are formed separately so that the respective metal gate electrodes may be formed using different materials.

However, the dummy gate removal step presents a number of challenges. For example, the metal layer 107 at the bottom the dummy gates may be oxidized. Another example, the spacers 108a and 108b may be damaged and metal residues may be formed during the metal gate electrode formation stage. Therefore, electrical shorting and device failure could occur.

Accordingly, what is needed in the art is an improved formation method for metal gate structure, so that the device performance can be satisfied.

BRIEF DESCRIPTION OF THE DRAWINGS

The disclosure will be described with reference to embodiments thereof as illustrated in the accompanying figures. It should be understood that the drawings are for illustrative purposes and are therefore not drawn to scale.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative of specific ways to make and use the invention, and do not limit the scope of the invention.

Figure 1:
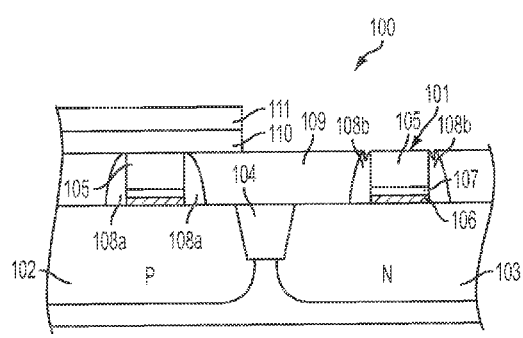
FIG. 1 shows a cross-sectional view of a plurality of conventional gate structures at a fabrication stage in a "gate last" process.
Figure 2:
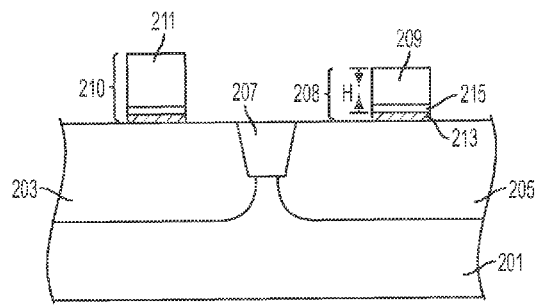
FIGS. 2 to 9 shows schematic cross-sectional views of a plurality of gate structures at various stages of fabrication according to an embodiment of the present disclosure.

Referring to FIG. 2, a substrate 201 includes a P-well region 203 and an N-well region 205 formed within the substrate 201. An isolation region 207 is formed in the substrate 201 to isolate the P-well region 203 and N-well region 205. In various embodiments, the substrate 201 comprises silicon or germanium in crystal, polycrystalline, or an amorphous structure. In some embodiments, the substrate 201 may include various doping configurations depending on design requirements (e.g., p-type substrate or n-type substrate). Further, in some embodiments, the substrate 201 may include an epitaxial layer (epi layer) for performance enhancement, and/or may include a silicon-on-insulator (SOI) structure.

In various embodiments, the P-well region 203 and the N-well region 205 may include various doping configurations depending on design requirements as known in the art. The P-well 203 region may be doped with n-type dopants, such as boron or BF2. The N-well region 205 may be doped with p-type dopants, such as phosphorus or arsenic. The P-well region 203 and the N-well region 205 can be configured respectively to provide channel regions for an N-type transistor and a P-type transistor in the following exemplary process.

In some embodiments, the isolation region 207 may utilize isolation technology, such as local oxidation of silicon (LOCOS) or shallow trench isolation (STI), to define and electrically isolate P-well region 203 and N-well region 205. In the present embodiment, the isolation region 207 includes a STI structure. The isolation region 207 may comprise silicon oxide, silicon nitride, silicon oxynitride, fluoride-doped silicate glass (FSG), other suitable insulating materials, and/or combinations thereof.

Still referring to FIG. 2, a first gate structure 208 and a second gate structure 210 are formed on the substrate 201. The first gate structure 208 and the second gate structure 210 may be formed using any suitable process. For example, in some embodiments, the gate structures 208, 210 may be formed by sequentially depositing and patterning a high-k dielectric layer 213, a metal cap layer 215, and a dummy gate electrode layer. The high-k dielectric layer 213 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, and/or combinations thereof. In various embodiments, the high-k dielectric layer 213 may be formed by any suitable process, such as atomic layer deposition (ALD), chemical vapor deposition (CVD), physical vapor deposition (PVD), other suitable process, and/or combinations The metal cap layer 215 is capable of protecting the high-k dielectric layer 213 from being damaged by the process for removing the first dummy gate electrode 209 and the second dummy gate electrode 211. The metal cap 215 can include materials such as TiN, TaN, or any suitable materials. The dummy gate electrode layer may comprise silicon, polysilicon, amorphous silicon, and any suitable materials. The dummy gate electrode layer may be formed by CVD, LPCVD, or other suitable processes.

In one embodiment, the materials for the high-k dielectric layer 213, the metal cap layer 215, and the dummy gate electrode layer are blanket deposited over the entire substrate surface. Then, a photoresist layer (not shown) is formed over the dummy gate electrode layer by a suitable process, such as spin-on coating, and patterned to form a patterned photoresist feature by a proper lithography patterning method. The patterned photoresist feature can then be transferred using a dry etching process to the underlying layers (i.e. a high-k dielectric layer, a metal cap layer and a dummy gate electrode layer) to form the first dummy gate electrode 209 and the second dummy gate electrode 211. The first dummy gate electrode 209 and the second dummy gate electrode 211 are substantially coplanar and have a height H.

Figure 3:
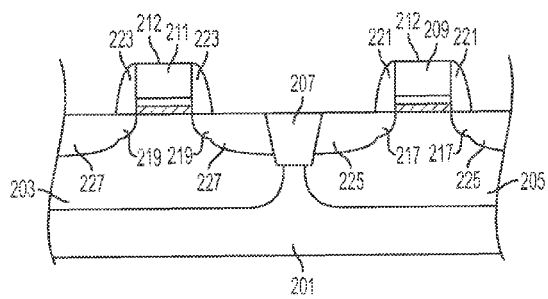

Referring to FIG. 3, lightly doped source/drain (LDD) regions 217, 219 may be formed in the P-well region 203 and the N-well region 205 by one or more implantation process, such as an ion implantation process. The doping species may depend on the type of device being fabricated, such as an NMOS or PMOS device. For example, in some embodiments, the LDD region 219 may be doped with n-type dopants, such as phosphorus or arsenic. LDD region 217 may be doped with p-type dopants, such as boron or BF2.

After the LDD formation process, a layer of spacer material is formed to cover the first dummy gate electrode 209 and the second dummy gate electrode 211. A plasma etching process is performed to pattern the spacer layer material to define first spacers 221 on sidewalls of the first dummy gate electrode 209 and second spacers 223 on sidewalls of the second dummy gate electrode 211. The spacer layer material, also the first spacers 221 and the second spacers 223, comprises silicon nitride, silicon oxynitride, and/or combination thereof.

Following the spacer formation process, source/drain regions 225, 227 are formed in the P-well 203 and N-well region 205. The source/drain regions 225, 227 may be formed by one or more ion implantation processes. The source/drain regions 225, 227 may comprise various doping profiles, and the source/drain region 225, 227 may be aligned with outer edges of first spacers 221 and second spacers 223.

Figure 4:
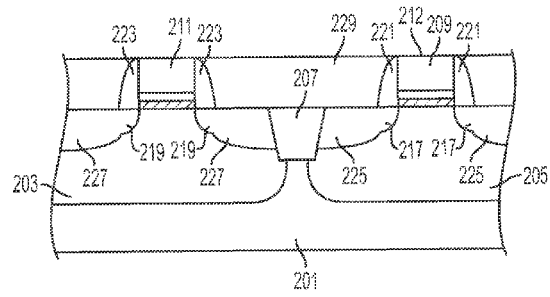

Referring to FIG. 4, an ILD layer 229 is formed to surround the first spacers 221 and second spacer 223. In some embodiments, the ILD layer 229 may comprise silicon oxide, spin-on glass (SOG), fluorinated silica glass (FSG), carbon doped silicon oxide (e.g. SiCOH), BLACK DIAMOND® (Applied Materials, Santa Clara, Calif., USA), other suitable dielectric materials, and/or combinations thereof. The ILD layer 229 may be formed over the first spacers 221 and the second spacers 223 by CVD, LPCVD, high density plasma deposition (HDP), spinning on glass, or any suitable process. Subsequently, the ILD layer 229 may be planarized by a chemical-mechanical-polishing (CMP) process until a top surface 212 of the first dummy gate electrode 209 and the second dummy gate electrode 211 are exposed.

Figure 5:
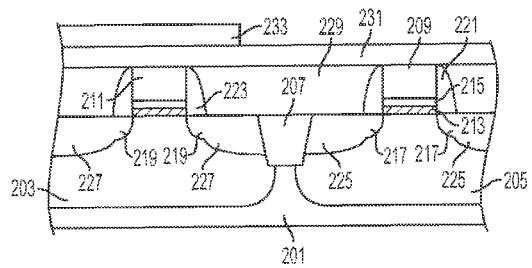

Referring to FIG. 5, a hardmask layer 231 is formed over the ILD layer 229, the first dummy gate electrode 209 and the second dummy gate electrode 211. In some embodiments, the hardmask layer 231 may comprise oxide, TiN, or other suitable materials. The hardmask layer 231 may be formed by CVD, PVD, or other suitable processes. Subsequently, the photoresist layer 233 is formed over the hardmask layer 231 by a suitable process, such as spin-on coating. The photoresist layer 233 is patterned to form a patterned photoresist feature 233 on the hardmask layer that cover a portion of the hardmask layer 231 over the second dummy gate electrode 211 and that leaves a portion of the hardmask layer 231 over the first dummy gate electrode 209 exposed.

Figure 6:
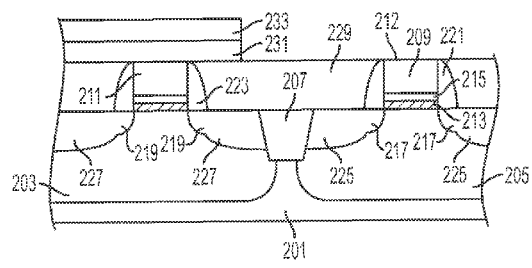

Referring FIG. 6, the portion of the exposed hardmask layer 231 over the first dummy gate electrode 209 is removed. The top surface 212 of the first dummy gate electrode 209 is exposed. In some embodiments, the hardmask layer 231 is removed by a dry etching process or wet etching process, or any suitable method.

Figure 7A:
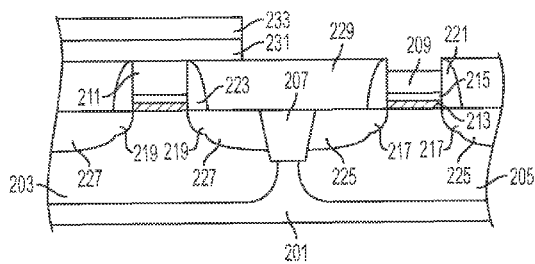

Referring to FIG. 7A, a top portion of the first dummy gate electrode 209 is removed in a first plasma environment. The top portion is about 20% to about 30% of the height H. In some embodiments, the first plasma environment may be plasma reactive ion process to etching the top portion. The first plasma environment comprises $Cl_2$, $O_2$, and HBr. In one embodiment, the first plasma environment comprises an inert gas such as Ar. The first plasma environment has a total gas volume flow comprises an $O_2$ gas volume flow, a Cl2 gas volume flow and an HBr gas volume flow. In some embodiments, a ratio of the $O_2$ gas volume flow to the total gas volume flow is about 4% to about 10%; a ratio of the Cl2 gas volume flow to the total gas volume flow is about 10% to about 25%; and a ratio of the HBr gas volume flow to the total gas volume flow is about 40% to about 60%. A total pressure of the first plasma environment is about 1.5 millitorrs (mT) to about 30 mT. An operation power of the first plasma environment is about 60 Watts (W) to about 1200 W. The $O_2$ gas would oxidize first spacers 221 and form byproduct to protect first spacers 221 from damage during the top portion removal. An etching selectivity of the first dummy gate electrode 209 to the first spacer 221 is about 90 to about 150.

Figure 7B:
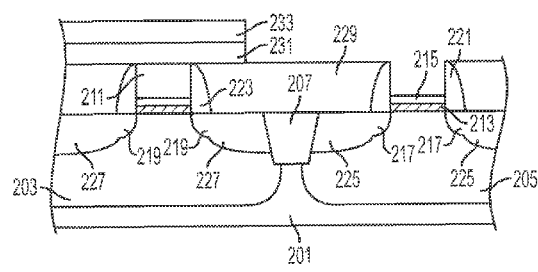

Referring to FIG. 7B, the remaining portion of the first dummy gate electrode 209 in FIG. 7A is removed in a second plasma environment. The second plasma environment produces a plasma reactive ion process that etches the first dummy gate electrode 209 and leave a hole surrounded by the first spacer 221. In some embodiments, the second plasma environment comprises $NF_3$, $Cl_2$, and HBr. In some embodiments, the second plasma environment has a total gas volume flow comprises an $NF_3$ gas volume flow, a $Cl_2$ gas volume flow, and HBr gas volume flow. In some embodiments, a ratio of the $NF_3$ gas volume flow to the total gas volume flow is about 1% to about 4%; a ratio of the Cl2 gas volume flow to the total gas volume flow is about 3% to about 10%; and a ratio of the HBr gas volume flow to the total gas volume flow is about 80% to about 95%. A total pressure of the second plasma environment is about 1 mT to about 10 mT. An operation power of the second plasma environment is about 600 W to about 1000 W. The $NF_3$ gas in HBr and $Cl_2$ mixture would protect the metal cap layer 215 from oxidize during the first dummy gate electrode 221 removal. An etching selectivity of the first dummy gate electrode 209 to the metal cap layer 215 about 400 to about 500.

Figure 8A:
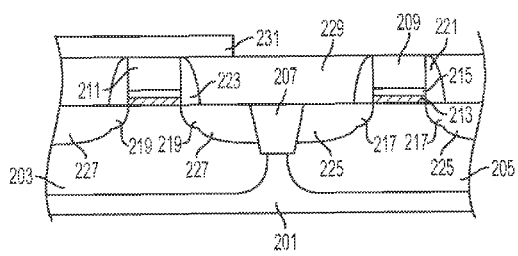
Figure 8B:
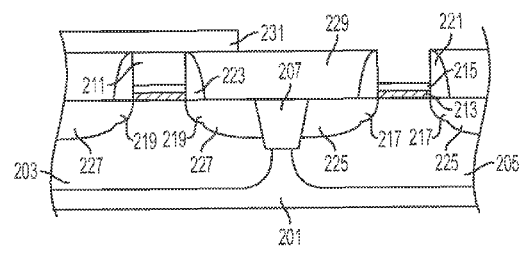

FIGS. 8A and 8B illustrate a variation of the process steps of FIGS. 7A and 7B in which the photoresist layer 233 is removed before the first dummy gate electrode 209 is removed in the second plasma environment. Referring to FIG. 8A, the photoresist layer 233 is removed in a third plasma environment that does not remove the hardmask layer 231 over the second dummy gate electrode 211. In some embodiments, the third plasma environment has a total gas volume flow comprising an $O_2$ gas volume flow and an N2 gas volume flow. In some embodiments, a ratio of the $O_2$ gas volume flow to the total gas volume flow is about 5% to about 30%; and a ratio of the N2 gas volume flow to the total gas volume flow is about 70% to about 95%. The removal of the photoresist layer 233 before the removal of first dummy gate electrode 209 helps to prevent the first spacer 221 from being damaged during the removal of the first dummy gate electrode 209 in the second plasma environment.

Referring to FIG. 8B, the first dummy gate electrode 209 is removed in the second plasma environment. The second plasma environment is the same process as discussed in FIG. 7B, which comprise $NF_3$, $Cl_2$, and HBr. The patterned hardmask layer 231 over the second dummy gate electrode 211 is not removed during the removal of the first dummy gate electrode 209. In another embodiment, the first dummy gate electrode 209 could be exposed to the first plasma environment prior to exposing in the second plasma environment. The first plasma environment is the same process as discussed in FIG. 7A, which comprise $Cl_2$, $O_2$ and HBr.

Figure 9:
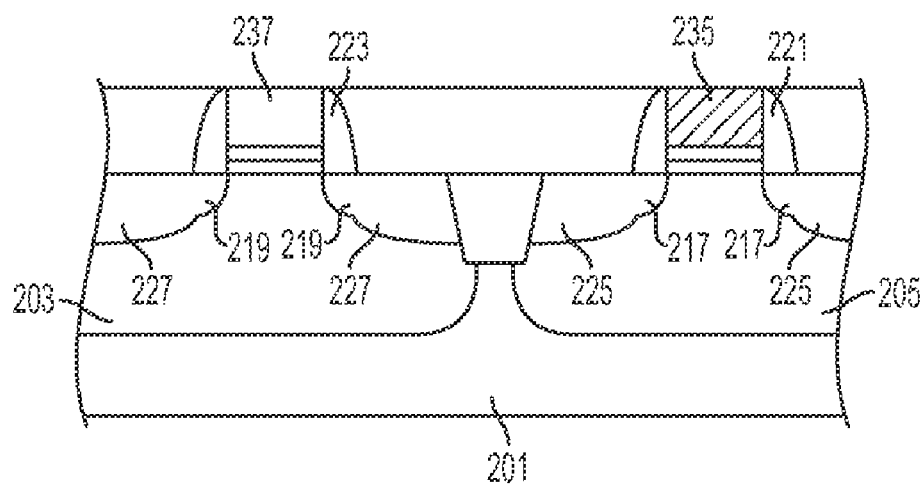

Referring to FIG. 9, P-type transistor 235 and an N-type transistor 237 are formed. The P-type transistor 235 is formed by depositing a first metal gate layer between first spacers 221. A CMP process may be performed to planarize the first metal gate layer to level a top surface of first spacers 221. The N-type transistor 237 is also formed by removing the second dummy gate electrode 211 and leaving a hole surrounded by the second spacers 223. A second metal gate layer is filled in the hole between second spacers and a planarization process is performed to form the N-type transistor 237. In some embodiments, the first metal gate layer and the second metal gate layer each comprise a material selected from a group of Al, Cu, AlTi, TiN, TiCN, TaN, TaCN, WN, and WCN.

Various embodiments of the present invention may be used to moderate the shortcomings of the metal gate structures manufacturing process. For example, the various embodiments may reduce the spacers be damaged during the dummy gate structure removal stage. The addition of $NF_3$ gas in HBr and $Cl_2$ mixture would protect the metal cap layer 215 from oxidized during the dummy gate electrode removal. Therefore, electrical performances of the devices can be improved.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming metal gate structures, comprising:
providing a substrate;
forming a first dummy gate electrode and a second dummy gate electrode on the substrate, wherein the first dummy gate electrode comprises first spacers on its sidewalls and the second dummy gate electrode comprises second spacers on its sidewalls;
forming a hardmask layer over both the first dummy gate electrode and the second dummy gate electrode;
forming a patterned photoresist layer on the hardmask layer that covers a portion of the hardmask layer over the second dummy gate electrode and that leaves a portion of the hardmask layer over the first dummy gate electrode exposed;
removing the portion of the exposed hardmask layer over the first dummy gate electrode;
exposing the first spacers and the first dummy gate electrode to a first plasma environment comprising $O_2$, HBr, and $Cl_2$;
removing the first dummy gate electrode in a second plasma environment comprising $NF_3$, $Cl_2$ and HBr thereby leaving a hole surrounded by the first spacers; and
filling the hole with a metal gate layer.

2. The method of claim 1, wherein the first plasma environment comprises an inert gas.

3. The method of claim 1, wherein the second plasma has a total gas volume flow comprising an $NF_3$ gas volume flow, a ratio of the $NF_3$ gas volume flow to the total gas volume flow is about 1% to 4%.

4. The method of claim 1, wherein the first dummy gate electrode and the second dummy gate electrode each comprises silicon, polysilicon, or amorphous silicon.

5. The method of claim 1, wherein the first dummy gate electrode has a height, and about 25% to about 30% of the height is removed when the first dummy gate electrode is exposed to the first plasma environment.

6. The method of claim 1, wherein each the first spacers and the second spacers comprises nitride or silicon oxynitride.

7. A method of forming metal gate structures, comprising:
providing a substrate;
forming a first dummy gate electrode and a second dummy gate electrode on the substrate, wherein the first dummy gate electrode comprises first spacers on its sidewalls and the second dummy gate electrode comprises second spacers on its sidewalls;
sequentially forming a hardmask layer and a photoresist layer on the first dummy gate electrode and the second dummy gate electrode;
patterning the photoresist layer to expose the hardmask layer over the first dummy gate electrode and removing the exposed hardmask layer to expose a top surface of the first dummy gate electrode while a portion of hardmask remains over the second dummy gate electrode;
removing the patterned photoresist layer in a first plasma environment comprising $O_2$, wherein a ratio of a gas volume flow of $O_2$ to a total gas volume flow of the first plasma environment is about 5% to about 30%;
removing the first dummy gate electrode within the first spacers in a second plasma environment, wherein the patterned hardmask layer over the second dummy gate electrode is not removed during the removal the first dummy gate electrode; and
depositing a metal gate layer between the first spacers.

8. The method of claim 7, further comprising removing a top portion of the first dummy gate electrode in a third plasma environment comprising $Cl_2$, $O_2$, and HBr, wherein a ratio of a gas volume flow of $O_2$ to a total gas volume flow of the third plasma environment is about 4% to about 10%.

9. The method of claim 7, wherein the second plasma environment comprises $Cl_2$, HBr, and $NF_3$, and a ratio of a gas volume flow of $NF_3$ to a total gas volume flow of the second plasma environment is about 1% to about 4%.

10. The method of claim 7, further comprises a metal cap layer underneath the first dummy gate electrode.

11. The method of claim 7, wherein the first dummy gate electrode and the second dummy gate electrode each comprises silicon, polysilicon, or amorphous silicon.

12. The method of claim 7, wherein the first spacers and the second spacers comprise nitride or silicon oxynitride.

13. A method of forming metal gate structures, comprising:
providing a substrate;
forming a first dummy gate electrode and a second dummy gate electrode on the substrate, wherein the first dummy gate electrode comprises first spacers on its sidewalls and the second dummy gate electrode comprises second spacers on its sidewalls;
forming a patterned hardmask layer to cover the second dummy gate electrode and leaves the first dummy gate electrode exposed;
removing of the first dummy gate electrode in a first plasma environment comprising $NF_3$, HBr, and $Cl_2$ thereby leaving a hole surrounded by the first spacers; and
filling the hole of the first spacers with a first metal gate layer.

14. The method of claim 13, wherein the first plasma environment comprises a ratio of a gas volume flow of $NF_3$ to a total gas volume flow of the first plasma environment is about 1% to 4%.

15. The method of claim 13, wherein the first dummy gate electrode and the second dummy gate electrode comprises silicon, polysilicon, or amorphous silicon.

16. The method of claim 13, wherein first spacers and second spacers comprises nitride or silicon oxynitride.

17. The method of claim 13, further comprises a patterned photoresist layer on the hardmask layer in the process step of removing of the first dummy gate electrode.

18. The method of claim 13, further comprises removing a top portion of the first dummy gate electrode in a second plasma environment comprising $O_2$, HBr and $Cl_2$.

19. The method of claim 16, further comprising
removing the second dummy gate electrode and leaving a hole surrounded by second spacers, and
filling a second metal gate layer in the hole in second spacers.

20. The method of claim 1, wherein the first plasma environment has a total gas volume flow comprising an $O_2$ gas volume flow, a ratio of the $O_2$ gas volume flow to the total gas volume flow is about 4% to about 10%.

* * * * *